(12) United States Patent
Kawai

(10) Patent No.: US 10,778,215 B2
(45) Date of Patent: Sep. 15, 2020

(54) SWITCHING CONTROL CIRCUIT

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventor: Shusuke Kawai, Fujisawa (JP)

(73) Assignees: KABUSHIKI KAISHA TOSHIBA, Minato-ku (JP); TOSHIBA ELECTRONICS DEVICES & STORAGE CORPORATION, Minato-ku (JP)

(*) Notice: Subject to any disclaimer, the term of this patent is extended or adjusted under 35 U.S.C. 154(b) by 0 days.

(21) Appl. No.: 16/129,300

(22) Filed: Sep. 12, 2018

(65) Prior Publication Data
US 2019/0288682 A1 Sep. 19, 2019

(30) Foreign Application Priority Data

Mar. 19, 2018 (JP) .................. 2018-051623

(51) Int. Cl.
| | |
|---|---|
| *H02M 3/157* | (2006.01) |
| *H02M 3/158* | (2006.01) |
| *H03K 17/567* | (2006.01) |
| *H03K 17/16* | (2006.01) |
| *H03K 17/687* | (2006.01) |
| *H02M 1/00* | (2006.01) |

(52) U.S. Cl.
CPC .......... *H03K 17/567* (2013.01); *H02M 3/157* (2013.01); *H02M 3/158* (2013.01); *H03K 17/165* (2013.01); *H03K 17/687* (2013.01); *H02M 2001/0006* (2013.01)

(58) Field of Classification Search
CPC .... H02M 3/157; H02M 3/158; H03K 17/165; H03K 17/567; H03K 17/687
USPC .......... 327/108, 109, 110, 111, 112
See application file for complete search history.

(56) References Cited

U.S. PATENT DOCUMENTS

| | | | |
|---|---|---|---|
| 8,710,876 B2* | 4/2014 | Lobsiger .......... | H03K 17/08148 327/109 |
| 9,184,744 B2 | 11/2015 | Kreuter et al. | |
| 2016/0043713 A1* | 2/2016 | Okuda ................ | H03K 17/302 327/432 |
| 2018/0366970 A1* | 12/2018 | Zhou ........................ | H02J 1/08 |
| 2019/0027923 A1* | 1/2019 | Toshiyuki ............ | H02H 7/1225 |

(Continued)

FOREIGN PATENT DOCUMENTS

JP 2019-57757 A 4/2019

OTHER PUBLICATIONS

Mathias Blank, et al. "Digital Slew Rate and S-Shape Control for Smart Power Switches to Reduce EMI Generation", IEEE Transactions on Power Electronics, vol. 30, No. 9, Sep. 2015, 11 pages.

*Primary Examiner* — William Hernandez
(74) *Attorney, Agent, or Firm* — Oblon, McClelland, Maier & Neustadt, L.L.P.

(57) ABSTRACT

A switching control circuit has a detector to detect a difference between a control object signal of a switching element to drive a load and a target signal of the control object signal, and gate adjustment circuitry to search for the timing at which the difference becomes the smallest by sweeping timing of adjustment of a gate signal of the switching element.

12 Claims, 9 Drawing Sheets

(56) References Cited

U.S. PATENT DOCUMENTS

2019/0089346 A1 3/2019 Kawai
2020/0144998 A1* 5/2020 Inoue ................ H03K 17/0828

* cited by examiner

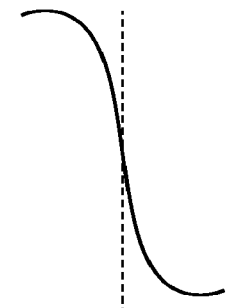
FIG. 2A
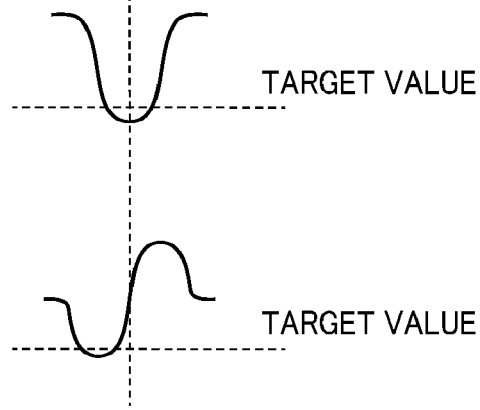
FIG. 2B — TARGET VALUE
FIG. 2C — TARGET VALUE
FIG. 3A  Vdac
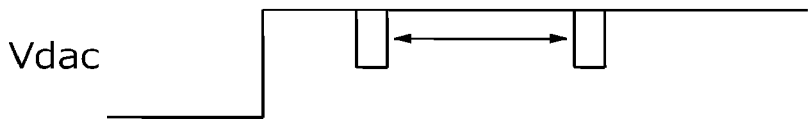
FIG. 3B  Vgs
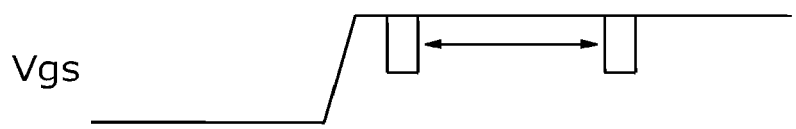
FIG. 3C  Vds
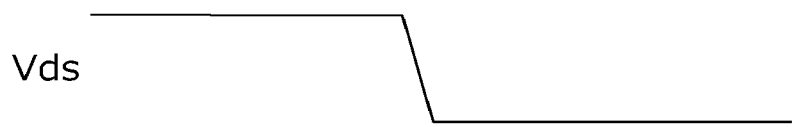
FIG. 3D  dVds/dt
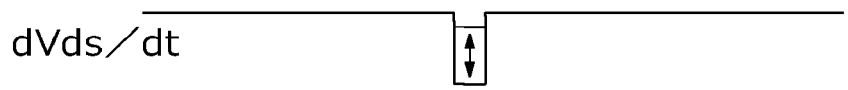

SWITCHING CONTROL CIRCUIT

CROSS REFERENCE TO RELATED APPLICATIONS

This application is based upon and claims the benefit of priority from the prior Japanese Patent Application No. 2018-51623, filed on Mar. 19, 2018, the entire contents of which are incorporated herein by reference.

FIELD

An embodiment of the present invention relates to a switching control circuit.

BACKGROUND

A driving circuit including a MOSFET with high pressure resistance (High breakdown voltage) is necessary to drive a large motor (large current). A supply voltage of this kind of driving circuit is around a several hundreds to one thousand volts and a gate voltage of a MOSFET is around 10 V. In the MOSFET, a loss is decreased but a noise is increased as transition time of a drain voltage or current of turning on/off becomes short.

There is a demand to control a derivative value of a drain voltage or a drain current of a MOSFET constantly in this kind of driving circuit. This is because it is possible to tune a noise and a loss by constantly controlling the derivative value (and break the trade-offs between loss and noise).

For example, it is considered to adjust a gate signal of a MOSFET in order to control a derivative value constantly. However, since a signal delay is generated in a driving circuit that generates the gate signal, there is a possibility that the derivative value cannot be controlled in an assumed manner due to an influence of this signal delay.

BRIEF DESCRIPTION OF THE DRAWINGS

FIG. 2A is a graph illustrating a drain-source voltage waveform of when a low-side MOSFET is turned on, FIG. 2B is a graph illustrating a first derivative value waveform of a drain-source voltage, FIG. 2C is a graph illustrating a second derivative value waveform of the drain-source voltage;

FIG. 3A to FIG. 3D are views illustrating a signal waveform of each unit in the switching control circuit in FIG. 1;

DETAILED DESCRIPTION

According to an embodiment a switching control circuit includes a detector to detect a difference between a control object signal of a switching element to drive a load and a target signal of the control object signal, and gate adjustment circuitry to find a timing select an instantaneous time at which the difference is at a minimum by changing a timing based on the difference among a plurality of time candidates for adjusting a gate signal of the switching element and to adjust the gate signal at the found timing selected instantaneous time.

In the following, an embodiment will be described with reference to the drawings. Note that in the present specification and the attached drawings, description and illustration are made with a part of a component being omitted, changed, or simplified for understandability and for convenience in the illustration. However, it is assumed that technology contents in a degree in which a similar function can be expected is included in the present embodiment.

Figure 1:
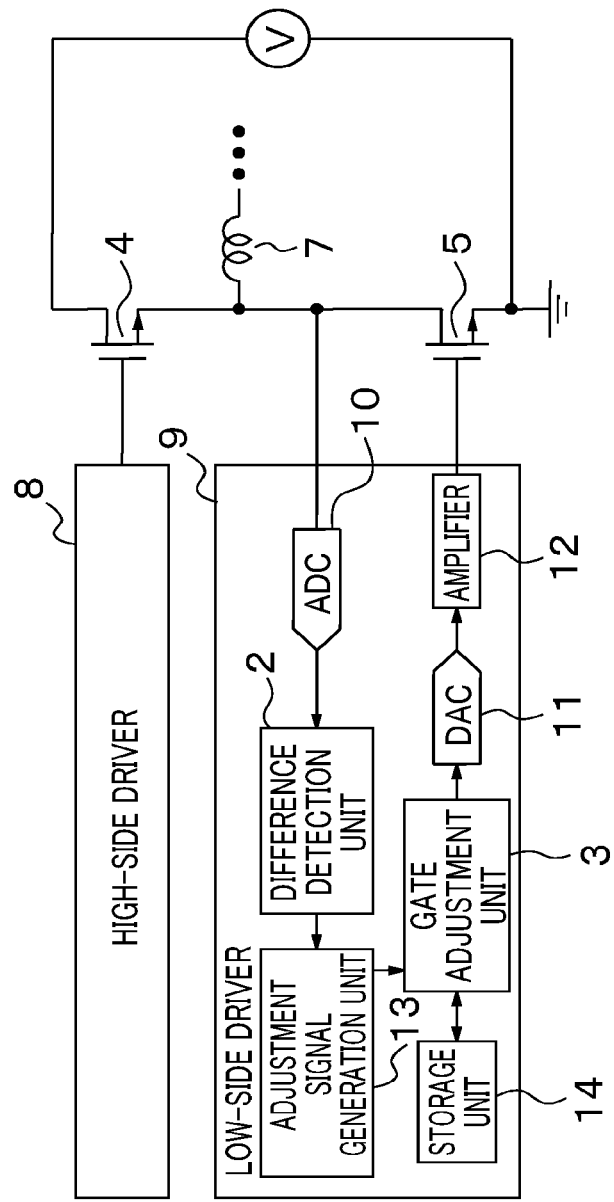
FIG. 1 is a block diagram illustrating a schematic configuration of a switching control circuit.

FIG. 1 is a block diagram illustrating a schematic configuration of a switching control circuit 1. The switching control circuit 1 in FIG. 1 includes a difference detection unit (detector) 2 and a gate adjustment unit (gate adjustment circuitry) 3.

For example, the switching control circuit 1 in FIG. 1 is included in a part of a driving circuit 6 including a high-side MOSFET 4 and a low-side MOSFET 5. This driving circuit 6 drives a load 7 such as a motor. The high-side MOSFET 4 and the low-side MOSFET 5 are connected in a cascode manner between a supply voltage and a ground voltage. In the present specification, the high-side MOSFET 4 and the low-side MOSFET 5 are collectively called a switching element.

A high-side driver 8 is connected to a gate of the high-side MOSFET and a low-side driver 9 is connected to a gate of the low-side MOSFET. The switching control circuit 1 in FIG. 1 is built, for example, in the low-side driver 9.

The difference detection unit 2 in the switching control circuit 1 in FIG. 1 detects a difference between a control object signal of the low-side MOSFET 5 and a target signal of this control object signal. Here, the control object signal is, for example, at least one of a first derivative value and a second derivative value of a drain-source voltage of the low-side MOSFET 5. FIG. 2A is a graph illustrating a drain-source voltage waveform of when the low-side MOSFET 5 is turned on, FIG. 2B is a graph illustrating a first derivative value waveform of a drain-source voltage, and FIG. 2C is a graph illustrating a second derivative value waveform of the drain-source voltage. The difference detection unit 2 detects a difference between a first derivative value and a target value illustrated in FIG. 2B or detects a difference between a second derivative value and a target value illustrated in FIG. 2C. Note that the difference detection unit 2 may detect a difference between an Nth derivative value (N is integer number equal to or larger than 2) and a target value. That is, the difference detection unit 2 detects a difference between at least one of a first derivative value and an Nth derivative value, and a target value.

In addition, the switching control circuit 1 in FIG. 1 includes an A/D converter (ADC, in the following) 10, a D/A converter (DAC, in the following) 11, and an amplifier 12.

For example, the ADC 10 detects a drain-source voltage of the low-side MOSFET 5 and converts this into a digital signal. The difference detection unit 2 detects a difference between a target signal and a first or second derivative value of the digital signal of the drain-source voltage of the low-side MOSFET 5.

By sweeping timing at which a gate signal of the low-side MOSFET 5 is adjusted, the gate adjustment unit 3 searches for timing at which the difference detected by the difference detection unit 2 becomes the smallest. More specifically, the gate adjustment unit 3 searches for timing at which a change amount in unit time of the first derivative value or the second derivative value of the drain-source voltage of the low-side MOSFET 5 becomes the largest.

In addition, the switching control circuit 1 in FIG. 1 may include an adjustment signal generation unit (adjustment signal generator) 13. The adjustment signal generation unit 13 generates an adjustment signal to adjust a gate signal of the switching element. The adjustment signal is a signal corresponding to the difference detected by the difference detection unit 2. In a period in which timing of adjustment of a gate signal of the switching element is swept, the gate adjustment unit 3 sweeps timing, at which an adjustment signal is added to the gate signal, in a state in which a signal waveform of the adjustment signal is commonalized. After the timing at which the difference becomes the smallest is searched for, the gate adjustment unit 3 searches for a signal level of an adjustment signal of when the difference becomes the smallest by sweeping the signal level of the adjustment signal.

The DAC 11 converts, into an analog signal, a gate signal adjusted by adding an adjustment signal to the gate signal. The amplifier 12 amplifies the analog signal output from the DAC 11 into signal amplitude necessary for driving the gate of the low-side MOSFET 5. The DAC 11 and the amplifier 12 are included in a gate driving unit (gate driver).

The switching control circuit 1 in FIG. 1 may include a storage unit 14. The storage unit 14 stores the addition timing of the adjustment signal and the signal level of the adjustment signal that are searched for by the gate adjustment unit 3. The gate adjustment unit 3 in FIG. 1 generates a gate signal on the basis of the addition timing of the adjustment signal and the signal level of the adjustment signal that are stored in the storage unit 14.

FIG. 3A to FIG. 3D are views illustrating a signal waveform of each unit in the switching control circuit 1 in FIG. 1. Each of an adjustment signal, which adjusts a gate signal, and a control object signal is a rectangular pulse in FIG. 3A to FIG. 3D for simplification but actually has a curved waveform illustrated in FIG. 2B, for example. FIG. 3A is a view illustrating a waveform of an output voltage Vdac of the DAC 11, FIG. 3B is a view illustrating a waveform of a gate-source voltage Vgs of the low-side MOSFET 5, FIG. 3C is a view illustrating a waveform of a drain-source voltage Vds of the low-side MOSFET 5, and FIG. 3D is a view illustrating a waveform of a first derivative value dVds/dt of the drain-source voltage Vds of the low-side MOSFET 5.

As illustrated in FIG. 3A, the gate adjustment unit 3 sweeps timing of an adjustment signal to adjust a gate signal. Thus, timing at which the output voltage Vdac of the DAC 11 is temporarily decreased is also swept. As illustrated in FIG. 3B, the gate-source voltage Vgs changes slightly after timing of a voltage change in the VDAC 11. When the timing of a voltage change in the VDAC 11 changes, the timing of Vds also changes in synchronization slightly thereafter.

As illustrated in FIG. 3D, when the timing of the change in the gate-source voltage Vgs changes, the first derivative value dVds/dt of the drain-source voltage Vds changes. Thus, in a case where the timing of the change in the gate-source voltage Vgs is optimal, it is possible to match the first derivative value dVds/dt with a target value.

Figure 4C:
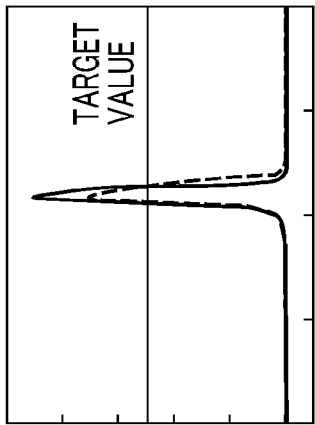
FIG. 4A to FIG. 4F are graphs illustrating a simulation waveform of a first derivative value dVds/dt with different delay amounts.
Figure 4B:
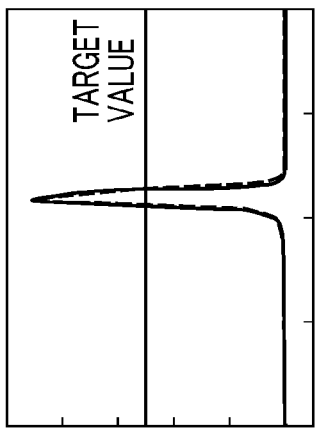
Figure 4A:
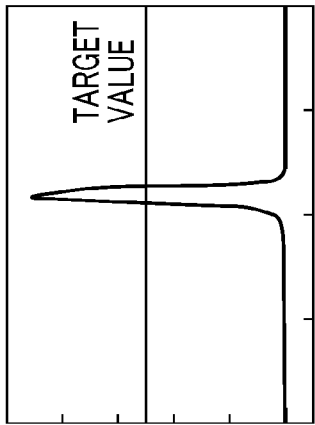
Figure 4F:
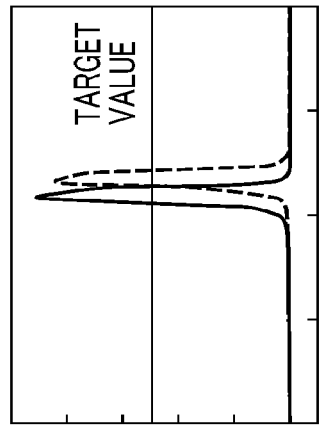
Figure 4E:
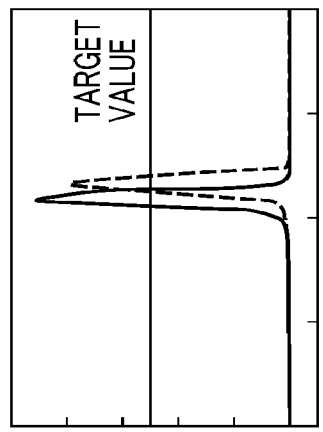
Figure 4D:
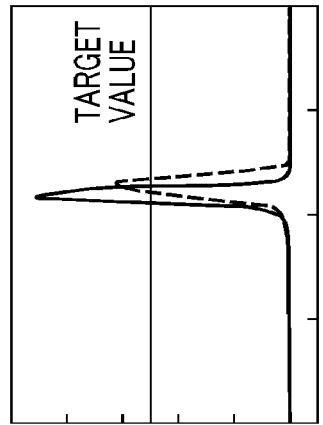

FIG. 4A to FIG. 4F are views illustrating a simulation waveform of the first derivative value dVds/dt of the drain-source voltage Vds of the low-side MOSFET 5. In each of FIG. 3A to FIG. 3D, a waveform of a case where the low-side MOSFET 5 is turned on is schematically illustrated. However, in each of FIG. 4A to FIG. 4F, a simulation waveform of a case where the low-side MOSFET 5 is turned off is illustrated. Thus, a direction of the waveforms in FIG. 4A to FIG. 4F is opposite to a direction of the waveforms in FIG. 3A to FIG. 3D. FIG. 4A is a graph illustrating a simulation waveform of a case where a delay amount=one unit, FIG. 4B is a graph illustrating that of a case where a delay amount=two units, FIG. 4C is a graph illustrating that of a case where a delay amount=three units, FIG. 4D is a graph illustrating that of a case where a delay amount=four units, FIG. 4E is a graph illustrating that of a case where a delay amount=five units, and FIG. 4F is a graph illustrating that of a case where a delay amount=six units. Here, a "unit" is unit reference time in simulation which time indicates a deviation amount of timing at which the output voltage Vdac of the DAC 11 is temporarily decreased.

In each of FIG. 4A to FIG. 4F, a waveform of the first derivative value dVds/dt in a case where a delay amount=0 (solid line) and a waveform of the first derivative value dVds/dt in each delay amount (broken line) are illustrated.

As a delay amount is gradually increased from zero, the first derivative value dVds/dt becomes smaller and becomes the closest to the target value when the delay amount=four units. When the delay amount exceeds four units, the first derivative value dVds/dt becomes large again and timing is deviated.

As illustrated in FIG. 3A to FIG. 4F, it is possible to search for timing, at which the first derivative value dVds/dt of the drain-source voltage Vds of the low-side MOSFET 5 becomes the closest to the target value, by sweeping the timing at which the output voltage Vdac of the DAC 11 is temporarily decreased.

However, as it is understood from the waveform (broken line) in FIG. 4D, it is not possible to match the first derivative value dVds/dt with the target value only by optimizing the timing at which the output voltage Vdac of the DAC 11 is temporarily decreased.

Thus, after optimal timing at which the output voltage Vdac of the DAC 11 is temporarily decreased is searched for, voltage magnitude of the output voltage Vdac of the DAC 11 is swept and amplitude of the first derivative value dVds/dt is changed, whereby an output voltage Vdac of the DAC 11 of when the first derivative value dVds/dt matches with the target value is searched for.

Figure 5A:
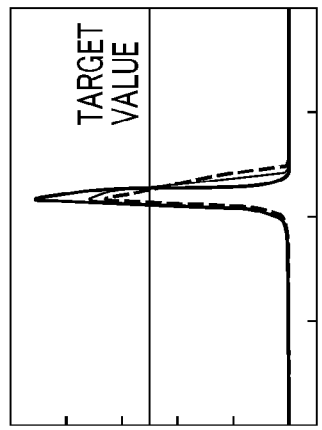
FIG. 5A to FIG. 5C are graphs illustrating a waveform change of the first derivative value dVds/dt of when voltage magnitude of an output voltage Vdac is swept.
Figure 5B:
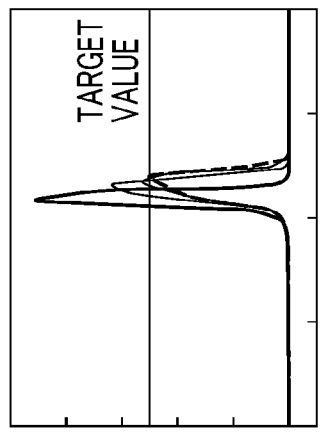
Figure 5C:
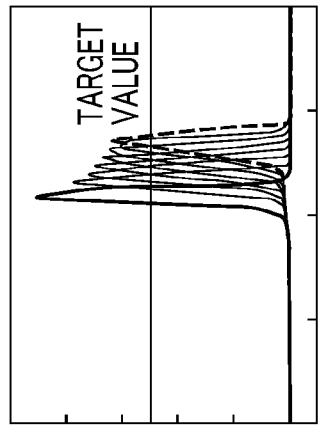

Each of FIG. 5A to FIG. 5C is a graph illustrating a waveform change of the first derivative value dVds/dt of when the voltage magnitude of the output voltage Vdac of the DAC 11 is swept. FIG. 5A is a graph illustrating a waveform change of the first derivative value dVds/dt of a case where the delay amount=three units in FIG. 4C, FIG. 5B is a graph illustrating a waveform change of the first derivative value dVds/dt of a case where the delay amount=four units in FIG. 4D, and FIG. 5C is a graph illustrating a waveform change of the first derivative value dVds/dt of a case where the delay amount=five units in FIG. 4E.

In a case where the delay amount=four units in FIG. 4D, it is possible to match the first derivative value dVds/dt with the target value by sweeping the voltage magnitude of the output voltage Vdac of the DAC 11. On the other hand, in a case where the delay amount=three units in FIG. 4C or the delay amount=five units in FIG. 4E, it is not possible to match the first derivative value dVds/dt with the target value even when the voltage magnitude of the output voltage Vdac of the DAC 11 is swept.

Figure 6:
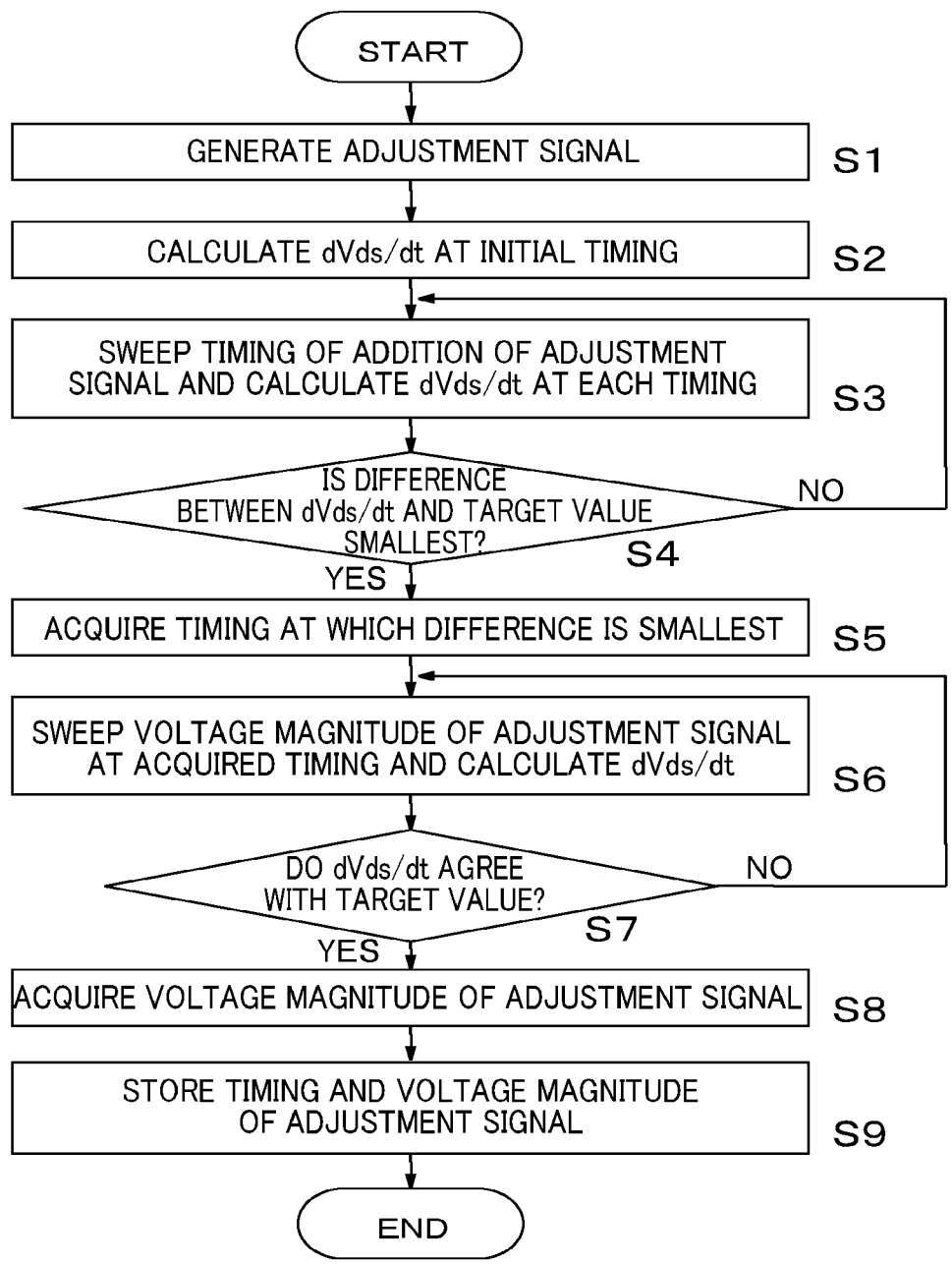
FIG. 6 is a flowchart illustrating a processing operation of a switching control circuit according to a first embodiment.

FIG. 6 is a flowchart illustrating a processing operation of a switching control circuit 1 according to a first embodiment. In this flowchart, processing of making a first derivative value dVds/dt of a drain-source voltage Vds of a low-side MOSFET 5 closer to a target value is performed.

First, an adjustment signal generation unit (adjustment signal generator) 13 generates an adjustment signal to temporarily decrease an output voltage Vdac of a DAC 11 (Step S1). This adjustment signal is a signal corresponding to a difference detected by a difference detection unit (detector) 2. Next, initial timing at which the output voltage Vdac of the DAC 11 is temporarily decreased is set, a drain-source voltage Vds of the low-side MOSFET 5 of when the output voltage Vdac of the DAC 11 is temporarily decreased at this initial timing by the above-described adjustment signal is detected, and a first derivative value dVds/dt thereof is calculated (Step S2).

Next, timing at which the output voltage Vdac of the DAC 11 is temporarily decreased by the above-described adjustment signal is swept, and the first derivative value dVds/dt is calculated at each timing (Step S3). It is determined whether a difference between the first derivative value dVds/dt and a target value becomes the smallest in the process in which the timing at which the output voltage Vdac of the DAC 11 is temporarily decreased by the above-described adjustment signal is swept (Step S4). When the above-described timing is swept, the difference between the first derivative value dVds/dt and the target value becomes gradually smaller, and becomes gradually larger after becoming a minimum value. Thus, it is possible to specify the minimum value by a change in the difference. When it is determined in Step S4 that the difference is not the minimum value yet, the processing returns to Step S3.

When it is determined in Step S4 that the difference becomes the minimum value, timing of the minimum value is acquired (Step S5). Next, at this timing, voltage magnitude of the above-described adjustment signal is swept and the first derivative value dVds/dt is calculated with each voltage magnitude (Step S6). It is determined whether the first derivative value dVds/dt matches with the target value in the process in which the voltage magnitude of the adjustment signal is swept (Step S7). As illustrated in FIG. 5A to FIG. 5C, the first derivative value dVds/dt gradually becomes closer to the target value. When a first derivative value dVds/dt of when the first derivative value dVds/dt matches with the target value, that is, of a case where a difference=0 is not acquired, the processing goes back to Step S6. When the first derivative value dVds/dt matches with the target value, voltage magnitude of the adjustment signal at that time is acquired (Step S8). In Step S9, the timing of the adjustment signal which timing is acquired in Step S5 and the voltage magnitude of the adjustment signal which magnitude is acquired in Step S8 are stored into a storage unit (memory) 14 in the switching control circuit 1 (Step S9). Accordingly, the switching control circuit 1 reads the timing and the voltage magnitude of the adjustment signal from the storage unit 14 and adjusts the output voltage Vdac of the DAC 11 by the adjustment signal.

The processing operation in FIG. 6 may be performed in an inspection process before shipment of a driving circuit 6. When the low-side MOSFET 5 is turned on or turned off after the shipment of the driving circuit 6, addition timing and voltage magnitude of an adjustment signal which are stored in the storage unit 14 are read and a gate signal is generated. Alternatively, the processing operation in FIG. 6 may be performed regularly or irregularly after the shipment.

Figure 7:
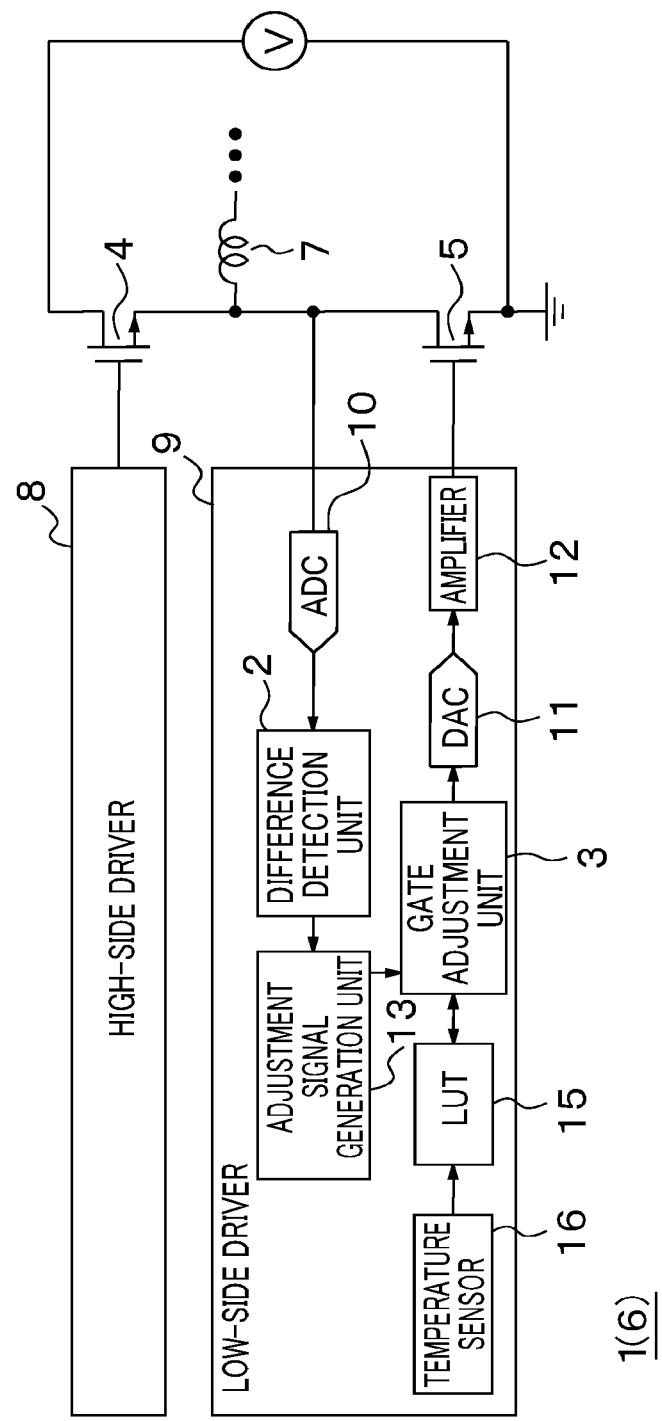
FIG. 7 is a block diagram illustrating a schematic configuration of a switching control circuit assumed to perform the processing operation in FIG. 6 after shipment of a driving circuit.

FIG. 7 is a block diagram illustrating a schematic configuration of a switching control circuit 1 assumed to perform the processing operation in FIG. 6 after shipment of a driving circuit 6. The switching control circuit 1 in FIG. 7 includes a look up table (LUT) 15 as a detailed example of the storage unit 14 in FIG. 1 and also includes a temperature sensor 16. When an ambient temperature of the switching control circuit 1 changes, there is a possibility that an electric characteristic of each part in a low-side MOSFET 5 or the switching control circuit 1 changes and optimal addition timing or voltage magnitude of an adjustment signal added to a gate signal changes. Thus, the switching control circuit 1 in FIG. 7 optimizes addition timing or voltage magnitude of an adjustment signal according to an ambient temperature of the switching control circuit 1.

The temperature sensor 16 in FIG. 7 measures an ambient temperature of the switching control circuit 1. The LUT 15 stores, for each of a plurality of temperatures, addition timing and voltage magnitude of an adjustment signal. When information is stored into the LUT 15, an ambient temperature of the switching control circuit 1 is changed, optimal values of addition timing and voltage magnitude of an adjustment signal at each temperature are calculated by simulation or a test, and the values are associated to each temperature and stored in the LUT 15. Thus, when an ambient temperature is measured by the temperature sensor 16, addition timing and voltage magnitude of an adjustment signal at the temperature can be easily acquired from the LUT 15.

In FIG. 7, an example in which addition timing and voltage magnitude of an adjustment signal are optimized according to an ambient temperature of the switching control circuit 1 is illustrated. However, addition timing and voltage magnitude of an adjustment signal may be optimized according to an environment condition such as ambient humidity or radio disturbance. Alternatively, addition timing and voltage magnitude of an adjustment signal may be optimized according to a supply voltage of the driving circuit 6.

Figure 8:
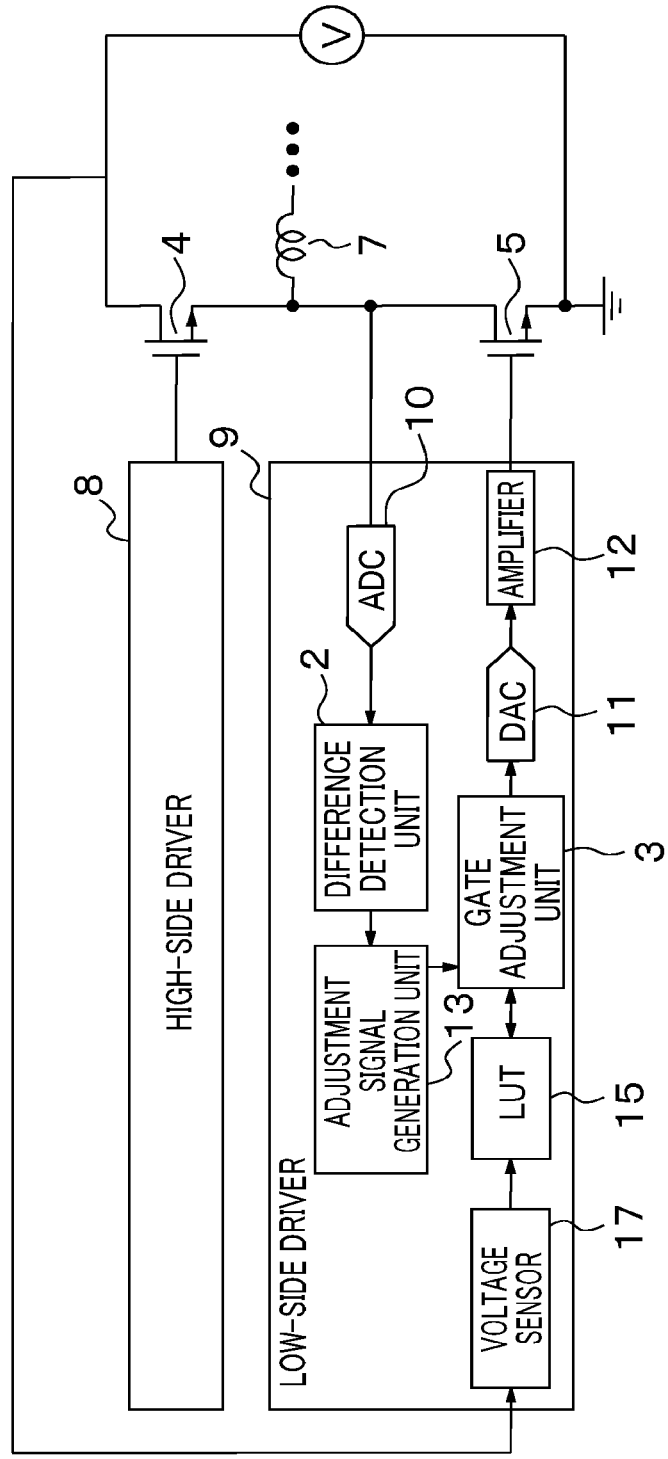
FIG. 8 is a block diagram illustrating a schematic configuration of a switching control circuit that optimizes addition timing and voltage magnitude of an adjustment signal according to a supply voltage.

FIG. 8 is a block diagram illustrating a schematic configuration of a switching control circuit 1 that optimizes addition timing and voltage magnitude of an adjustment signal according to a supply voltage of a driving circuit 6. The switching control circuit 1 in FIG. 8 includes, instead of the temperature sensor 16 in FIG. 7, a voltage sensor 17 that detects a voltage level of a supply voltage supplied to a high-side MOSFET 4 and a low-side MOSFET 5. An LUT 15 stores, for each of a plurality of voltage levels, addition timing and voltage magnitude of an adjustment signal. When information is stored into the LUT 15, a supply voltage of the driving circuit 6 is changed, optimal values of addition timing and voltage magnitude of an adjustment signal at each voltage level are calculated by simulation or a test, and the values are associated to each voltage level and stored in the LUT 15. Thus, when a voltage level of a supply voltage is detected by the voltage sensor 17, addition timing and voltage magnitude of an adjustment signal at the voltage level can be easily acquired from the LUT 15.

Figure 9:
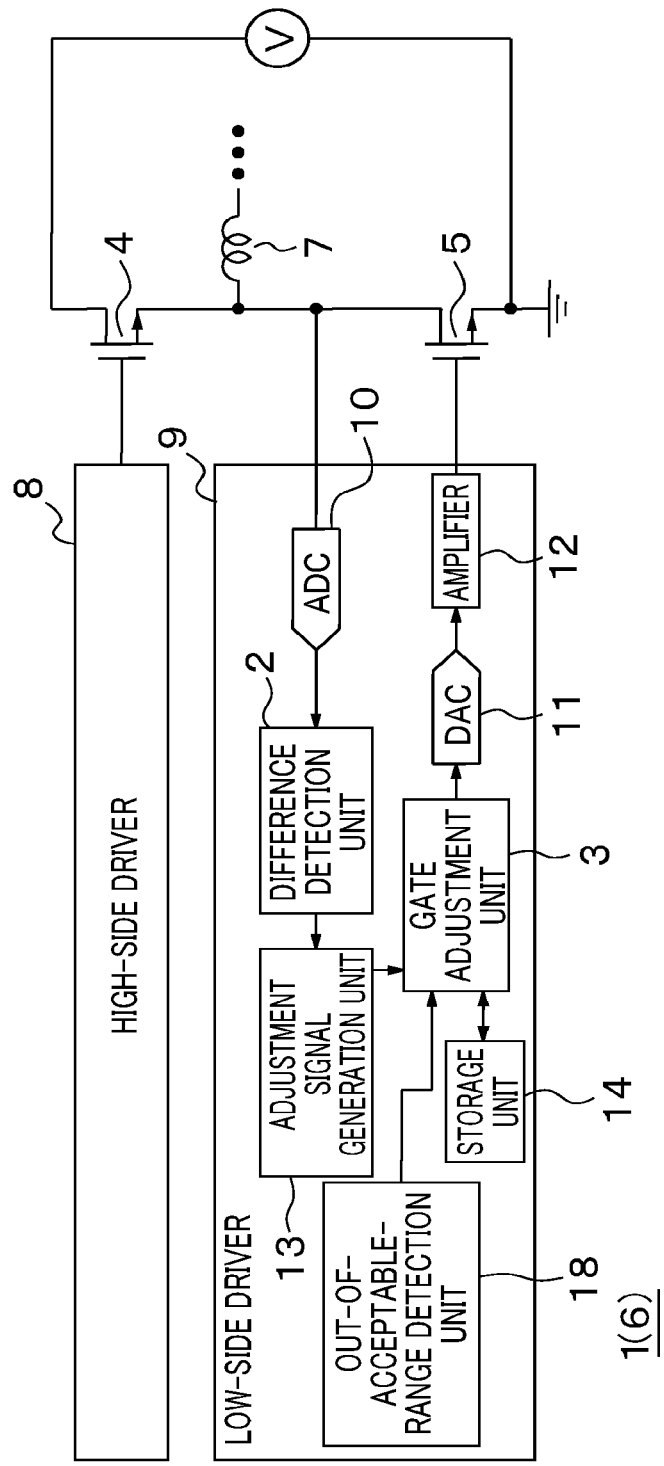
FIG. 9 is a block diagram of a switching control circuit that searches for addition timing and signal amplitude of an adjustment signal when an environmental condition is deviated from a predetermined acceptable range.

FIG. 9 is a block diagram of a switching control circuit 1 that searches for addition timing and signal amplitude of an adjustment signal when an environmental condition or the like such as a temperature is deviated from a predetermined acceptable range. The switching control circuit 1 in FIG. 9 includes an out-of-acceptable-range detection unit (out-of-acceptable-range detector) 18 in addition to the configuration in FIG. 1. The out-of-acceptable-range detection unit 18 detects that at least one of an environment condition, an electric characteristic and a supply voltage of a switching element is deviated from a predetermined acceptable range. When a deviation from the acceptable range is detected by the out-of-acceptable-range detection unit 18, a gate adjustment unit (gate adjustment circuitry) 3 searches for addition timing and signal amplitude of an adjustment signal. The searched addition timing and signal amplitude of an adjustment signal may be stored into the storage unit 14.

In FIG. 1 to FIG. 9 described above, an example in which control of matching a first derivative value or a second derivative value of a drain-source voltage of a low-side MOSFET 5 with a target value has been described. However, control of matching a first derivative value or a second derivative value of a drain current or a source current of the low-side MOSFET 5 with a target value may be performed.

Figure 10:
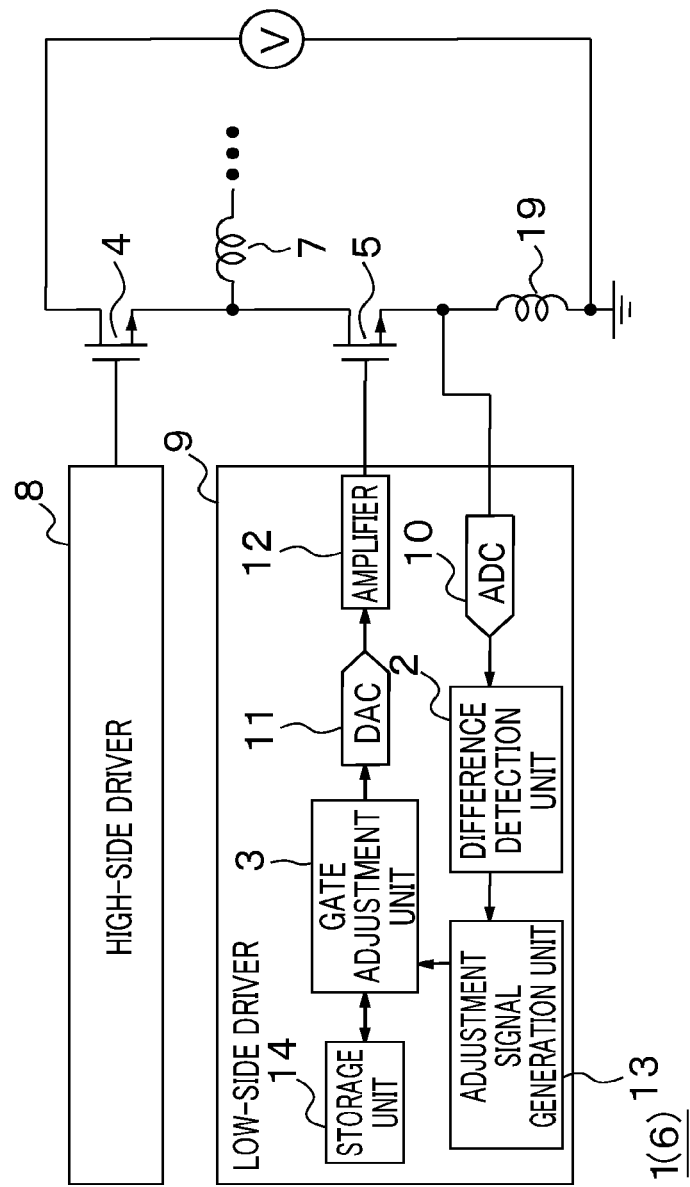
FIG. 10 is a block diagram illustrating an example of a driving circuit that can detect a drain current of a low-side MOSFET.

FIG. 10 is a block diagram illustrating an example of a driving circuit 6 that can detect a drain current of a low-side MOSFET 5. An inductor 19 is connected between a source of the low-side MOSFET 5 and a ground node. The inductor 19 is not a physical inductor element but is a parasitic inductor by wiring between the source of the low-side MOSFET 5 and the ground node.

A voltage of a connection node between the source of the low-side MOSFET 5 and the parasitic inductor 19 is input into an ADC 10. A voltage between both ends of the inductor 19 becomes a voltage calculated by multiplying a temporal change amount of a source current by inductance. Thus, it is possible to convert a drain or source current of the low-side MOSFET 5 into voltage by the parasitic inductor 19 existing between the source of the low-side MOSFET 5 and the ground node and to make an internal configuration of the switching control circuit 1 similar to those in FIG. 1 to FIG. 9.

In such a manner, in the present embodiment, when a low-side MOSFET 5 is turned on or turned off, timing at which a difference between a first derivative value or a second derivative value of a drain-source voltage of the low-side MOSFET 5 and a target value becomes the smallest is searched for while timing of adding an adjustment signal that adjusts a gate signal of the low-side MOSFET 5 is swept. When the timing is searched for, signal amplitude of an adjustment signal of when the first derivative value or the second derivative value of the drain-source voltage of the low-side MOSFET 5 matches with the target value is searched for while the signal amplitude of the adjustment signal is swept. Accordingly, it is possible to match the first derivative value or the second derivative value of the drain-source voltage of the low-side MOSFET 5 with the target value when the low-side MOSFET 5 is turned on or turned off.

In the above-described embodiment, an example of making a first derivative value or a second derivative value of a drain-source voltage of a low-side MOSFET 5 in a driving circuit 6 match with a target value has been described. However, by performing a processing operation similar to that in FIG. 6, it is possible to match a first derivative value or a second derivative value of a drain-source voltage of a high-side MOSFET 4 with a target value.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A switching control circuit comprising:
a detector to detect a difference between a control object signal of a switching element to drive a load and a target signal of the control object signal; and
gate adjustment circuitry to select a predetermined time based on the difference among a plurality of time candidates for adjusting a gate signal of the switching element, and to adjust the gate signal at the selected predetermined time.

2. The switching control circuit according to claim 1,
wherein the detector detects the difference when the switching element is turned on or turned off, and
the gate adjustment circuitry selects the predetermined time at which the difference is a minimum by changing the timing for adjusting the gate signal of the switching element when the switching element is turned on or turned off.

3. The switching control circuit according to claim 1,
wherein the gate adjustment circuitry selects the predetermined time at which the difference between the control object signal and the target signal is at a maximum.

4. The switching control circuit according to claim 1,
wherein the control object signal is at least one of (1) a first derivative value of a drain-source voltage, or (2) a second derivative value of a drain-source voltage, or (3) a drain current of the switching element,
the target signal is a target value at a predetermined level, and
the detector detects a difference between at least one of (1) the first derivative value or (2) an Nth (N is integer number equal to or larger than 2) derivative value and the target value.

5. The switching control circuit according to claim 4,
wherein the control object signal is at least one of (1) the first derivative value or (2) the second derivative value of the drain current of the switching element,
further comprising a parasitic inductor connected to a path in which the drain current of the switching element flows, and
an A/D converter to convert, into a digital control object signal, a voltage corresponding to a temporal change of current flowing in the parasitic inductor.

6. The switching control circuit according to claim 1,
further comprising an adjustment signal generator to generate an adjustment signal to adjust the gate signal of the switching element,
wherein the gate adjustment circuitry changes timing of adding the adjustment signal to the gate signal in a state in which a signal waveform of the adjustment signal is normalized in a period in which the timing of adjustment of the gate signal of the switching element is changed.

7. The switching control circuit according to claim 1, wherein the gate adjustment circuitry selects the predetermined times at which the control object signal matches with the target signal by changing signal amplitude of an adjustment signal after the predetermined time at which the difference is at a minimum is selected.

8. The switching control circuit according to claim 1, further comprising an out-of-acceptable-range detector to detect that at least one of an environment condition, an electric characteristic, or a supply voltage of the switching element is deviated from a predetermined acceptable range,
wherein when a deviation from the acceptable range is detected, the gate adjustment circuitry selects the predetermined time from among the plurality of time candidates.

9. The switching control circuit according to claim 1, further comprising a memory to store the selected predetermined time selected by the gate adjustment circuitry, and
a gate driver to generate the gate signal of the switching element on the basis of the selected predetermined time stored in the memory.

10. The switching control circuit according to claim 9, further comprising a temperature sensor to measure an ambient temperature of the switching element,
wherein the memory stores the predetermined time corresponding to the temperature measured by the temperature sensor, and
the gate driver reads, from the memory, the predetermined time corresponding to the temperature measured by the temperature sensor and generates the gate signal of the switching element on the basis of the read predetermined time.

11. The switching control circuit according to claim 9, further comprising a voltage sensor to detect a supply voltage of the switching element,
wherein the memory stores the predetermined time corresponding to the voltage detected by the voltage sensor, and
the gate driver reads, from the memory, the predetermined time corresponding to the voltage detected by the voltage sensor and generates the gate signal of the switching element on the basis of the read predetermined time.

12. The switching control circuit according to claim 1, wherein the gate adjustment circuitry selects the predetermined time at which the difference is at a minimum by selecting a time among the plurality of time candidates for adjusting the gate signal of the switching element, and to adjust the gate signal at the selected predetermined time.

\* \* \* \* \*